(12) United States Patent
Singh et al.

(10) Patent No.: US 8,497,704 B2
(45) Date of Patent: Jul. 30, 2013

(54) METHODS AND STRUCTURE FOR SOURCE SYNCHRONOUS CIRCUIT IN A SYSTEM SYNCHRONOUS PLATFORM

(75) Inventors: Devendra Bahadur Singh, Lucknow (IN); Anand Sadashiv Date, Pune (IN); Hrishikesh Suresh Sabnis, Pune (IN)

(73) Assignee: LSI Corporation, San Jose, CA (US)

( * ) Notice: Subject to any disclaimer, the term of this patent is extended or adjusted under 35 U.S.C. 154(b) by 77 days.

(21) Appl. No.: 13/185,019

(22) Filed: Jul. 18, 2011

(65) Prior Publication Data

US 2013/0021059 A1    Jan. 24, 2013

(51) Int. Cl.
*H03K 19/177* (2006.01)
*H01L 25/00* (2006.01)

(52) U.S. Cl.
USPC .................................. 326/41; 326/38; 326/47

(58) Field of Classification Search
USPC .................................. 326/37–41, 47; 710/71
See application file for complete search history.

(56) References Cited

U.S. PATENT DOCUMENTS

| | | | |
|---|---|---|---|
| 6,789,959 B1 | 9/2004 | Conn | |
| 6,945,712 B1 | 9/2005 | Conn | |
| 7,091,890 B1 * | 8/2006 | Sasaki et al. | 341/100 |
| 7,619,451 B1 | 11/2009 | Hoang et al. | |

OTHER PUBLICATIONS

Mahmud, "Prototyping an ASIC with FPGAs," FAE at Synplicity.
Kodavalla et al., "FPGA prototyping of complex SoCs: Partitioning and Timing Closure Challenges with Solutions," D&R Industry Articles | downloaded http://www.design-reuse.com/articles/?id=12690&print=yes on Mar. 4, 2011.
Greg Burton, "16-Channel, DDR LVDS Interface with Per-Channel Alignment," Application Note: Virtex-5 FPGAs, Xilinx, XAPP855 (v1.0) Oct. 13, 2006.
Nick Sawyer," Source-Synchronous Serialization and Deserialization (up to 1050 Mb/s)," Application Note: Spartan-6 FPGAs, Xilinx, XAPP1064 (v1.1) Jun. 3, 2010.

* cited by examiner

*Primary Examiner* — Jany Richardson
(74) *Attorney, Agent, or Firm* — Duft Bornsen & Fettig LLP

(57) ABSTRACT

Methods and circuits in an application circuit to compensate for skew in the transmission of serial data between field programmable gate arrays (FPGAs) in the application circuit. A clock signal source external to both FPGAs generates a clock signal applied to both FPGAs. A transmitting FPGA generates a serial data stream comprising the current values of a plurality of signals within the transmitting FPGA and transmits the serial data stream based on its clock signal. The receiving FPGA receives the serial data stream and applies a programmed delay to the received serial data stream to compensate for skew in received serial data stream relative to its clock signal. The programmed delay value may be determined at initialization (or reset) of the FPGAs by transmitting synchronization data from the first transmitting FPGA to the receiving FPGA. The receiving FPGA adjusts a programmable delay while receiving synchronization data until it sense bit and word alignment relative to its clock signal.

4 Claims, 5 Drawing Sheets

METHODS AND STRUCTURE FOR SOURCE SYNCHRONOUS CIRCUIT IN A SYSTEM SYNCHRONOUS PLATFORM

BACKGROUND

1. Field of the Invention

The invention relates generally to circuit design for serial signal clocking between circuits and more specifically relates to methods and circuit structures for source synchronous timing in exchange of signals between circuits in a system synchronous circuit platform design.

2. Discussion of Related Art

Digital electronic circuit designs have evolved over many years as complexity and density of designs both rise. Present day circuit designs permit such density that so-called "system-on-a-chip" (SOC) designs have developed in which all circuits for an entire application can be designed into a single integrated circuit package.

It is very costly to modify a large, complex, dense SOC integrated circuit design to correct errors in the logic designs. Therefore, circuit designers for such application circuits often test their logic designs long before the final SOC circuit die is designed and laid out. In testing their designs, engineers typically simulate the designs using computational simulators. Eventually, the designs are committed to some prototype circuits to test in the intended application environment. In such rapid prototyping environments, it is common to use programmable logic devices such as Field Programmable Gate Arrays (FPGAs). Since the size and complexity of an SOC may exceed the logic gate capacity of present day FPGAs it is common to use a prototyping board that is populated with multiple, interconnected FPGAs.

In implementing an SOC (or other complex circuit designs) on multiple FPGAs it is common to "partition" blocks of the application logic such that logic blocks may be distributed over various of the FPGAs. The partitioning process by the circuit designer is largely automated by computer aided engineering (CAE) tools however the designer may provide input to the CAE tools to reduce the number of signals that must be exchanged between the various FPGAs to couple the logic blocks.

A large number of signals to be exchanged between the multiple FPGAs to interconnect the logic blocks gives rise to a variety of problems. First, the number of signal pins on each interconnected FPGA used for exchange of signals may be limited based on the specifications of the selected FPGA circuits. To resolve this issue, it is known to multiplex the transfer of signals between interconnected FPGAs by serializing the multiplexed signals, transmitting the serialized data to the receiving FPGA and de-serializing the multiplexed signals at the receiving FPGA. Such serial transmission of the multiplexed signals dramatically reduces the complexity of FPGA interconnection required on the FPGAs for exchange of interconnecting signals. Many commercially available FPGA circuits include serializer/de-serializer (SERDES) circuits that may be used for this purpose. (See, e.g., Xilinx application notes "XAPP1064" and "XAPP855").

Other problems remain even when using SERDES features of FPGAs for exchange of logic block interconnections. The serialized data transfer must be associated with some clocking mechanism. One prior technique exchanged the serial data in an "asynchronous" mode. A protocol involving handshake signals to synchronize the start of a transmission and to complete a transmission is utilized. The addition of such handshake protocols negatively impacts the maximum data rate for the exchange of the serialized signals. Slowing the data rate for the exchange of FPGA interconnect signals may impact the performance of the entire SOC circuit design prototype.

Another prior technique uses "source synchronous" clocking wherein the source of the transmitted serialized data generates a data clock and transmits its generated clock to the receiving FPGA along with the serialized data stream. The receiving FPGA may also generate a clock used within the receiving FPGA to de-serialize the received data. Generation of these clock signals within the interconnected FPGAs utilizes phase locked loop (PLL) logic within the FPGAs to generate the clock signals based on some other clock signal (e.g., a core logic clock) within the FPGA. PLL logic within the FPGAs may utilize precious resources of the FPGA logic circuits and thus consumes some of the scarce logic resources of the FPGAs. The problem of requiring a PLL in each FPGA for interconnect clocking is further exacerbated where one or more FPGAs have multiple interconnects with other FPGAs. For example, where multiple FPGAs are all interconnected with a central "control" FPGA (i.e., in a "star" topology), the central FPGA may require numerous PLL components be designed—one or more for each other FPGA with which the central FPGA is connected. Such a design requires substantial logic be dedicated within the FPGAs merely for clocking of the various interconnect signals among the FPGAs.

Thus it is an ongoing challenge to exchange signals between multiple FPGAs of an application circuit with simple structures while reducing overhead that may impact performance of the application circuit as implemented in multiple, partitioned FPGAs.

SUMMARY

The present invention solves the above and other problems, thereby advancing the state of the useful arts, by providing methods and structure in an application circuit to compensate for skew in the transmission of serial data between field programmable gate arrays (FPGAs) in the application circuit. A clock signal source external to both FPGAs generates a clock signal applied to both FPGAs. A transmitting FPGA generates a serial data stream comprising the current values of a plurality of signals within the transmitting FPGA and transmits the serial data stream based on its clock signal. The receiving FPGA receives the serial data stream and applies a programmed delay to the received serial data stream to compensate for skew in received serial data stream relative to its clock signal. The programmed delay value may be determined at initialization (or reset) of the FPGAs by transmitting synchronization data from the first transmitting FPGA to the receiving FPGA. The receiving FPGA adjusts a programmable delay while receiving synchronization data until it sense bit and word alignment relative to its clock signal.

In one aspect hereof, an application circuit is provided. The application circuit comprises a first field programmable gate array (FPGA) having a serial data output signal and having a clock signal input and a second FPGA having a clock signal input and having a serial data input signal. The application circuit also comprises a clock signal source external to both the first and second FPGAs. The clock signal source adapted to generate a clock signal applied to the clock signal inputs of both the first and second FPGAs. The first FPGA further comprises an output serializer/de-serializer (OSERDES) circuit adapted to generate and output on the serial data output a serial data stream. The serial data stream represents current values of a plurality of signals within the first FPGA. The OSERDES transmits the serial data stream based on the clock signal received on its clock signal input. The second FPGA further comprises a programmable delay circuit having an input signal coupled with the serial data output signal of the first FPGA and having a clock signal input adapted to receive the clock signal and having an output signal. The programmable delay circuit adapted to apply a programmed delay to the serial data stream to generate a delayed serial data stream and further adapted to apply the delayed serial data stream to its output signal. The second FPGA also comprises an input serializer/de-serializer (ISERDES) adapted to receive the delayed serial data stream output from the programmable delay circuit and further adapted to de-serialize the delayed serial data stream to generate the current values of the plurality of signals within the first FPGA for use within the second FPGA. The programmable delay of the programmable delay circuit compensates for skew of serial data stream received by the second FPGA relative to the clock signal used by the OSERDES.

Another aspect hereof provides a method operable in a circuit, the circuit comprising a first FPGA and a second FPGA and a clock signal source external to the first and second FPGAs. The method comprises applying a clock signal from the clock signal source to both the first and second FPGAs and generating a serial data stream in the first FPGA. The serial data stream comprises current values of a plurality of signals within the first FPGA. The method further comprises transmitting the serial data stream from the first FPGA to the second FPGA. The serial data stream is transmitted from the first FPGA based on the clock signal received by the first FPGA. The serial data stream is received by the second FPGA based on the clock signal received by the second FPGA. The method also comprises compensating, within the second FPGA, for skew of the received serial data stream relative to the clock signal applied to the first and second FPGAs and de-serializing the received serial data stream within the second FPGA to generate the current values of the plurality of signals within the first FPGA for use within the second FPGA.

DETAILED DESCRIPTION OF THE DRAWINGS

Figure 1:
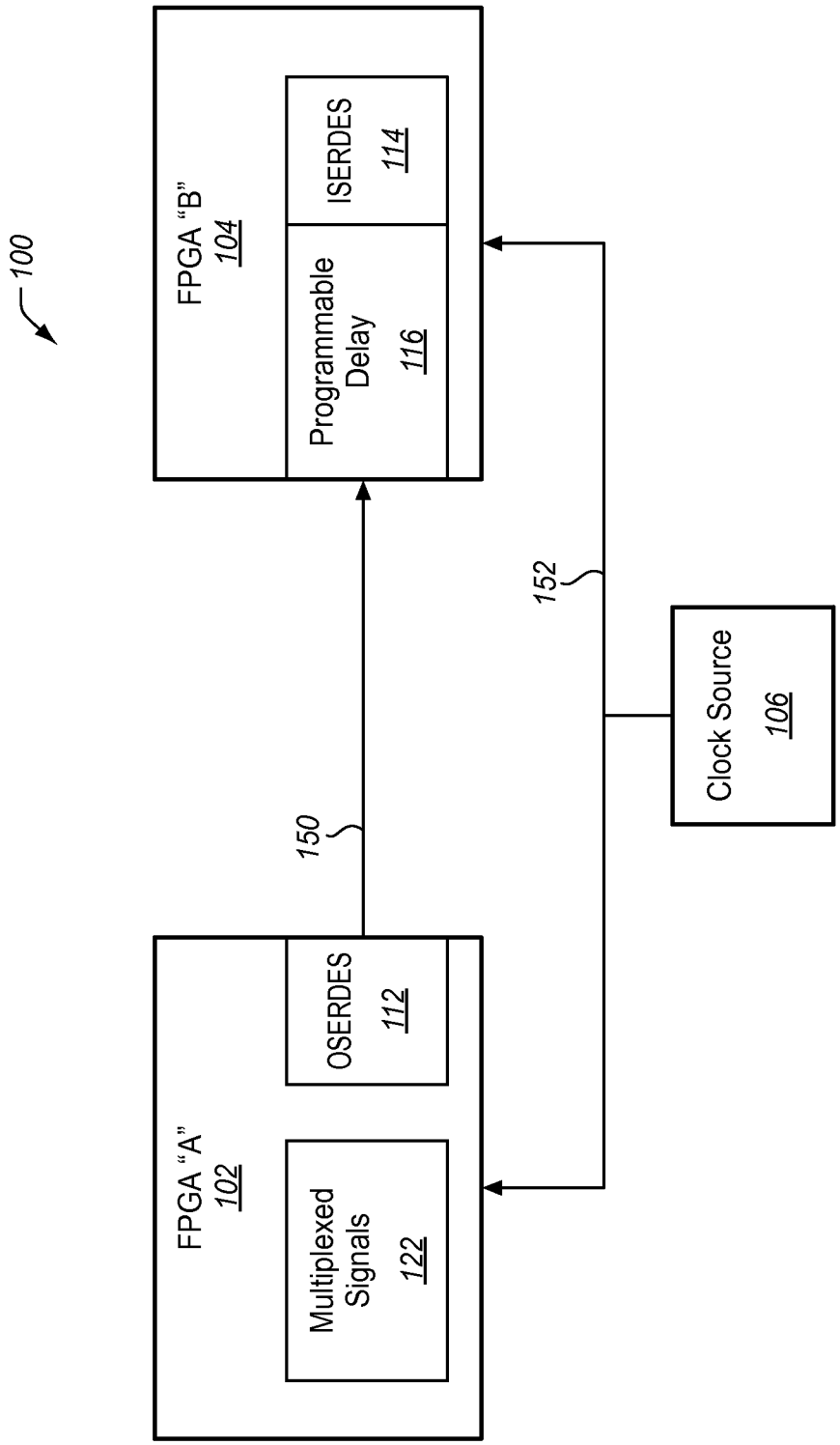
FIG. 1 is a block diagram of an exemplary application circuit for transmitting signals between FPGAs of the application circuit in accordance with features and aspects hereof.

FIG. 1 is a block diagram of an exemplary system 100 enhanced in accordance with features and aspects hereof to improve interconnect communications between multiple FPGAs of system 100. System 100 comprises FPGA "A" 102 and FPGA "B" 104. FPGA 102 comprises a source of multiplexed signals 122 to be communicated from FPGA 102 to FPGA 104. Multiplexed signals 122 may comprise any signals generated or used within FPGA 102 useful or required in operation of FPGA 104. For example, where FPGAs 102 and 104 form the partitioned logic of an application circuit (i.e., system 100), then a variety of signals may be exchanged and/or shared between FPGAs 102 and 104 to provide the desired functionality of the application circuit. Core logic of FPGA 102 implementing the intended application functions may be the source for multiplexed signals 122. Any number of signals required for exchange between FPGAs 102 and 104 may be multiplexed limited only by the requirements of the application circuit (i.e., system 100).

Multiplexed signals 122 are applied to output serializer/de-serializer (OSERDES) 112 of FPGA 102 to generate a serial data stream representing the present values of multiplexed signals 122. The generated serial data stream is applied to path 150 as an output of OSERDES 112 and received as a serial data stream by FPGA 104. FPGA 104 comprises a programmable delay circuit 116 adapted to receive the serial data stream on 150 and further adapted to apply a programmed delay to the received serial data stream to thereby generate a delayed serial data stream. Those of ordinary skill in the art will readily recognize that a programmable "delay" circuit may provide for both positive and negative "delay" values such that a signal may be either advanced or delayed to adjust for timing. Thus, as used herein, "delay" (or "delay value" or "delayed signal") with reference to the programmable delay circuit may represent either delay or advance of a signal depending upon the "delay value" programmed into the delay circuit. The generated delayed serial data stream is applied as an input to input serializer/de-serializer (ISERDES) 114 of FPGA 104. ISERDES 114 then de-serializes the delayed serial data stream to reproduce multiplexed signals 122 for utilization by application related core logic of FPGA 104.

In accordance with features and aspects thereof, a common clock signal source 106 supplies the same clock signal to both FPGA 102 and FPGA 104 via clock signal path 152. The clock signal generated by clock signal source 106 may, in some embodiments, provide the "core" clock signal for operation of all logic circuits in FPGAs 102 and 104. As is well known in the art, other clock frequencies may be generated within each of FPGAs 102 and 104 as required for the particular application in each FPGA. Suitable phase locked loop (PLL) circuits within each of FPGAs 102 and 104 may generate higher frequency clocks and well-known clock divider circuits may be utilized to generate lower frequency clocks as required by functions within the core application circuit of FPGAs 102 and 104.

In accordance with features and aspects hereof, programmable delay circuit 116 is programmed by operation of FPGA 104 to compensate for any relative skew detected in the clock signals received by FPGAs 102 and 104. Thus, as compared to prior techniques for exchange of signals between multiple FPGAs of system 100, a single clock source may be used to maximize the data transfer rate for the serial data stream between FPGA 102 and FPGA 104 while also simplifying adaptation for relative skew between the clock signals as applied to each of the multiple FPGAs.

In some embodiments, programmed delay circuit 116 may be further adapted to adjust relative skew to assure that the clocking signals used by ISERDES 114 of receiving FPGA 104 to sample a serial data stream are aligned such that bit transitions are centered within the bit time period of the skew adjusted clock signal. By assuring such adjustment for bit-centered sampling of the delayed serial data stream by ISERDES 114, a double data rate (DDR) serial data stream may be supported to further improve the bit rate of the serial data stream communication between FPGAs 102 and 104. Still further, as noted above, system 100 advantageously reduces, relative to prior techniques, the number of logic circuits consumed within FPGAs 102 and 104 for generation of source synchronous clocks associated with the transmission of the serial data stream (e.g., PLL logic circuits utilized for the PLL generation of a source synchronous clock to be transmitted in parallel with the serial data stream). The structure of system 100 also advantageously simplifies the design process for an application circuit prototype using multiple FPGAs where the application logic circuits are partitioned/divided among a plurality of FPGAs for rapid prototyping purposes.

Those of ordinary skill in the art will readily recognize that FPGAs 102 and 104 may be implemented as any suitable programmable logic arrays (PLA). FPGAs are merely one example of suitable programmable logic arrays that may be utilized for implementing transmission of the serial data stream between any two FPGAs of system 100. Further, those of ordinary skill in the art will recognize that any number of such FPGAs may be present in system 100 any number of which utilize a single common clock signal source 106 for clocking of the serial data stream transmitted between any two of the multiple FPGAs. Still further, those of ordinary skill in the art will readily recognize that although the above description of FIG. 1 discusses only transmission of signals from a first FPGA (102) to a second FPGA (104), an identical structure may be present to transmit signals in the opposite direction (i.e., where FPGA 104 provides an OSERDES circuit coupled to a programmable delay in FPGA 102 which is, in turn, coupled to an ISERDES and skew adjustment logic within FPGA 102).

Figure 2:
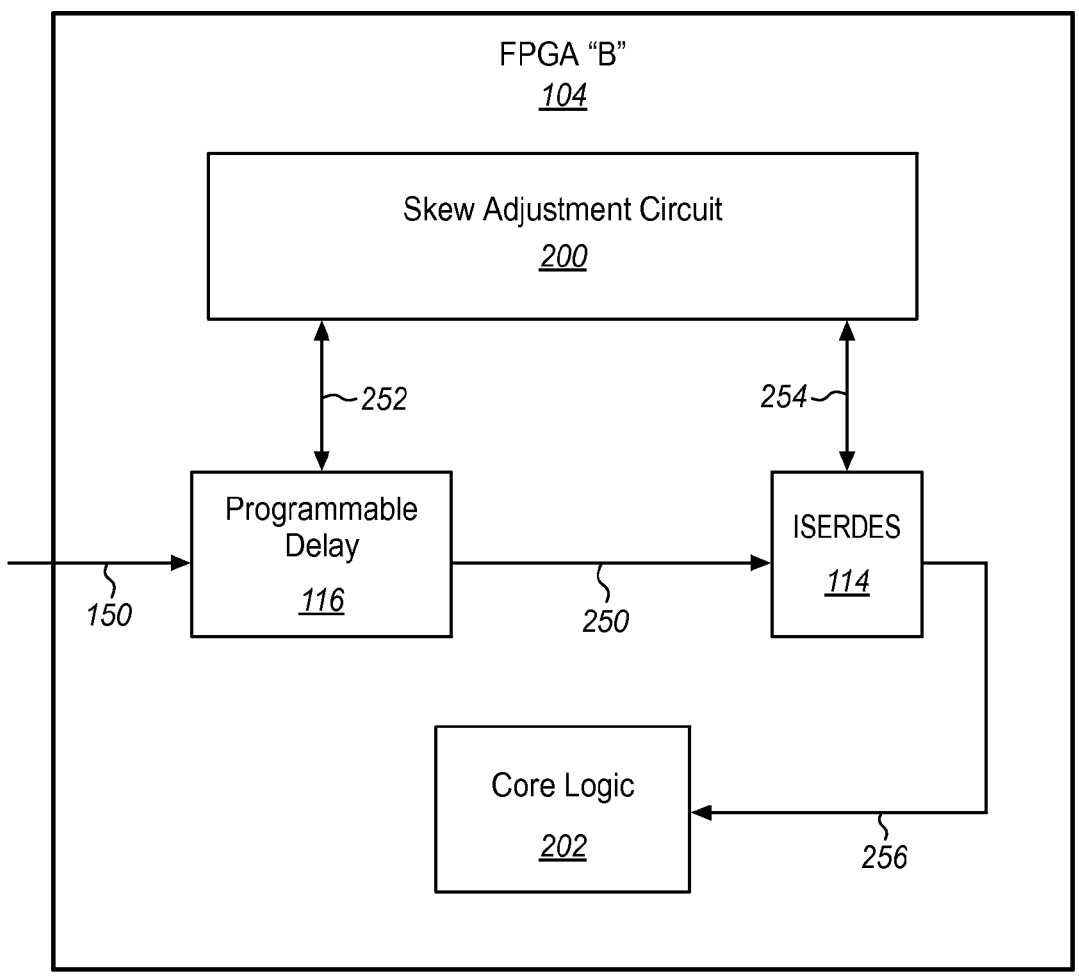
FIG. 2 is a block diagram providing additional exemplary details of the second (receiving) FPGA of FIG. 1 in accordance with features and aspects hereof.

FIG. 2 is a block diagram providing exemplary additional details of an embodiment of FPGA "B" 104 of FIG. 1. As the receiver of a serial data stream comprising multiplexed signals from another FPGA, FPGA "B" 104 includes skew adjustment circuit 200 adapted to determine and program via path 252 a programmable delay value into programmable delay circuit 116. The programmed delay value imposes a desired delay on the serial data stream values received on path 150 to generate a delayed serial data stream on path 250. The programmed delay value compensates for relative skew of the common clock signal as received in the transmitting and receiving FPGAs. The delayed serial data stream on path 250 is, in turn, applied as an input to ISERDES 114. ISERDES 114 de-serializes the delayed serial data stream to generate (re-generate or reproduce) the multiplexed signals from a transmitting FPGA. The reproduced multiplexed signals are then applied via path 256 to core logic 202 of FPGA "B" 104 for use in the intended application specific logic of core logic 202. Core logic 202 represents any logic circuits designed to implement the intended application specific features of the FPGA—specifically, core logic 202 implements some partitioned portion of the application function along with counterpart logic in other interconnected FPGAs.

Skew adjustment circuit 200 is any suitable logic to adjust the programmed delay value for use in programming delay circuit 116. In general, skew adjustment circuit 200 is operable during initialization (or re-initialization due to reset signals or other reset or recovery conditions). During initialization of the system comprising the interconnected FPGAs (e.g., a system on a chip or "SOC"), the transmitting FPGA may generate a synchronization pattern of bits. The synchronization pattern allows a receiving FPGA to synchronize its operation to receive the serial data stream by adjusting the delay imposed on the serial data stream by programmable delay circuit 116. The skew adjustment compensates for differences between the common system clock as applied to the transmitting FPGA and as applied to the receiving FPGA (i.e., FPGA "B" 104). Still further, skew adjustment circuit 200 adjusts, via signals on path 252, the programmable delay value in programmable delay circuit 116 until circuit 200 detects proper alignment of bits of the serial data stream with the common system clock signal (i.e., the clock signal received on path 152 as shown in FIG. 1). Skew adjustment circuit 200 detects bit alignment by exchange of signals with ISERDES 114 via path 254 or by any other suitable logic sampling the serial data stream and comparing the detected data bit signal transitions with the system clock. Once bit alignment is detected, skew adjustment circuit 200 awaits detection of word alignment by ISERDES 114. In one exemplary embodiment, the synchronization pattern includes bit patters arranged in identifiable "word" boundaries. Word boundaries in the delayed serial data stream received via path 250 are detected by ISERDES 114 and detection of such a word boundary may be signaled to skew adjustment circuit 200 via path 254.

Once bit and word alignment is detected, skew adjustment circuit 200 may signal that its associated receiver logic is ready for normal operation. FPGA 104 may then signal other FPGAs when its initialization is completed based, in part, on the completion of the synchronization of the serial data stream communication path with another FPGA. Where an FPGA is coupled with multiple other FPGAs, skew adjustment logic associated with each serial data stream communication path may perform similar synchronization. In some embodiments, skew adjustment logic 200 may be designed to perform synchronization for all such serial data stream interconnection communication paths of an FPGA. Further logic within the FPGA may await completion of synchronization of all of its interconnections with other FPGAs before signaling its readiness for normal operation.

Those of ordinary skill in the art will readily recognize numerous equivalent and additional elements that may be present in a fully functional system of FPGAs such as in FIGS. 1 and 2. Such additional and equivalent elements are omitted herein for simplicity and brevity of this discussion.

Figure 3:
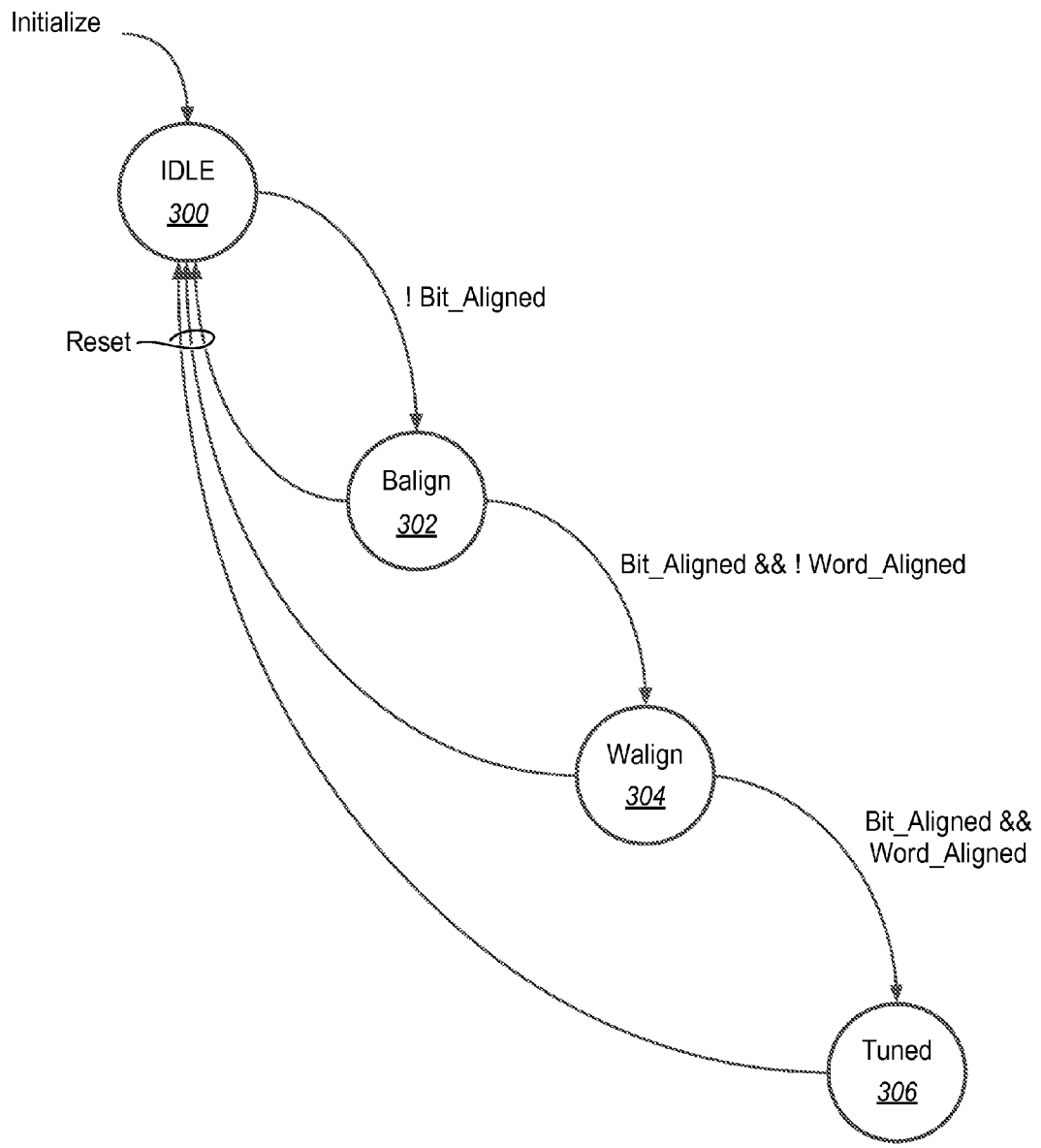
FIG. 3 is a diagram of an exemplary state machine model operable within the second (receiving) FPGA to determine skew adjustment values based on received synchronization data in accordance with features and aspects hereof

Operation of a receiving FPGA such as FPGA 104 of FIGS. 1 and 2 may also be described as a state model such as that shown in FIG. 3. The state machine of FIG. 3 begins at system initialization in IDLE state 300. A "reset" operation performed on the FPGA from any state may also return the state machine to the IDLE state 300. From IDLE state, a determination is made that the FPGA is not yet "bit aligned" (i.e., the synchronization data pattern either has not yet been received or the FPGA is not yet bit aligned to the bit pulses of the synchronization data). A "Bit_Aligned" signal may be utilized within the FPGA to signify whether the FPGA is presently in a bit aligned state. Detecting this condition causes a transition to the "Balign" state 302. In the Balign state, the FPGA adjusts the clock skew to attempt to align the synchronization data bit pattern to have a desired timing relationship to the synchronization data bit pulses. More specifically, in the Balign state, the skew adjustment circuit of the FPGA adjusts the programmable delay value until the clock pulses and the data bit pulses of the synchronization data are properly aligned. As noted above, in a DDR application of the FPGA interconnect communications, edges of data bit pulses are aligned with clock signal pulses such that clock signal pulses are centered in a data bit pulse period.

Once proper bit alignment is detected (by assertion of a "Bit_Aligned" signal), the state machine transitions to the "Walign" state 304. In the Walign state, the state machine awaits completion of word alignment with the receive synchronization data. Word alignment may be signaled within the FPGA state machine logic by a signal "Word_Aligned".

Word alignment comprises detecting the beginning of an encoded word of bits of the serial data stream represented by the synchronization data.

Upon detecting both Word_Aligned and Bit_Aligned being asserted, the state machine logic transitions to the "Tuned" state 306 in which normal operation of the FPGAs communicating with one another is commenced. As noted above, a "reset" signal (including for example a power off and on circumstance) may be signaled to the FPGA logic at any time thus resetting the state machine of FIG. 3 back to the IDLE state 300.

In one exemplary embodiment, once the communication channel is initialized between the two FPGAs (i.e., having entered the "Tuned" state or in other words a functional state, a continuous stream of multiplexed signals may be transmitted so that bit and word synchronization is maintained throughout operation of the system. The transmissions from the transmitting FPGA to the receiving FPGA is a continuous stream of the multiplexed current values to be communicated from the transmitting FPGA to the receiving FPGA so that the current logic signal values of the selected, multiplexed logic signals are available for the logic of the receiving FPGA. In general there is no need for an encoding of the current values (i.e., there is no need for an encoding to assure a minimum number of transitions on the communication path such as 8b10b encoding used in some high speed serial communication media and protocols). Rather, the multiplexing and de-multiplexing log of the communicating FPGAs merely have matching multiplexing logic to always encode the selected logic signals in the transmitter and to decode the multiplexed current signal values in the same multiplexed order over the serial signal path. This approach can even assure the maintenance of bit and word synchronization through various types of logic resets of the communicating FPGAs. Those of ordinary skill in the art will recognize other techniques for either maintaining desired synchronization or for re-establishing synchronization from time to time as required.

The following pseudo-code example further clarifies exemplary operation of the receiving FPGA using the improved inter-connection communication techniques and structures hereof.

```
/****************************************************************
RX STATE MACHINE
After reset RX side will see stream of zeros coming in
Wait till input is not equal to zero (signifying DCM has locked
                                     and there is a stable clock)
BA_INCDLY1: Look for SYNC_PAT or its variants (SYNC_PAT_1 or
                                     SYNC_PAT_2)
                                     if curr_ch_data is not equal to SYNC_PAT or either of
                                         its two variants increase IOdelay and check.
                                     if tap delay count reaches 3F and neither of the sync
                                         pattern is found decrease the tap delay count
                                     If de-serialized data from serdes equals pre-defined sync
                                         pattern (6'h2D) current channel is already
                                         synchronized go to next channel else generate bit-
                                         slip-pulse to align data with the sync pattern
In GBSP state bit slip pulse is generate for one clkdiv period.
Once bitslip pulse is generated wait for 2 clock period to see effect
on the data output
If new data is aligned go to next channel
If current channel count is equal to CHANNEL_NOS-1, RX I/F is
                                     synchronized with the TX I/P
                                     generate sync_done indicating I/F synced.
****************************************************************/
always @(/*AS*/SYNC_PAT_1 or SYNC_PAT_2 or SYNC_PAT_3 or SYNC_PAT_4
                                     or SYNC_PAT_5 or `SDW or ch_cnt or clkdiv_cnt
                                     or curr_ch_data or curr_ch_data_d1 or curr_state
                                     or dly_calc or dly_tap_cnt or mux_rst_n)
begin : rx_sm_async
    nxt_state = BA_IDLE;
    case (curr state)
//////////////////bitalign_start//////////////////////////////
        BA_IDLE          : begin
            nxt_state = #1 BA_INCDLY1;
        end // case: BA_IDLE
        BA_INCDLY1 : begin
            if (((curr_ch_data != SYNC_PAT) && (curr_ch_data_d1 != SYNC_PAT))
                                     && ((curr_ch_data != SYNC_PAT_1) &&
                                         (curr_ch_data_d1 != SYNC_PAT_1))
                                     && ((curr_ch_data != SYNC_PAT_2) &&
                                         (curr_ch_data_d1 != SYNC_PAT_2))
                                     && ((curr_ch_data != SYNC_PAT_3) &&
                                         (curr_ch_data_d1 != SYNC_PAT_3))
                                     && ((curr_ch_data != SYNC_PAT_4) &&
                                         (curr_ch_data_d1 != SYNC_PAT_4))
                                     && ((curr_ch_data != SYNC_PAT_5) &&
                                         (curr_ch_data_d1 != SYNC_PAT_5)))
                nxt_state = #1 curr_state;
            else if (((curr_ch_data == SYNC_PAT) &&
                                         (curr_ch_data_d1 != SYNC_PAT))
                                     || ((curr_ch_data == SYNC_PAT_1) &&
                                         (curr_ch_data_d1 != SYNC_PAT_1))
                                     || ((curr_ch_data == SYNC_PAT_2) &&
                                         (curr_ch_data_d1 != SYNC_PAT_2))
```

```
                            || ((curr_ch_data == SYNC_PAT_3) &&
                                    (curr_ch_data_d1 != SYNC_PAT_3))
                            || ((curr_ch_data == SYNC_PAT_4) &&
                                    (curr_ch_data_d1 != SYNC_PAT_4))
                            || ((curr_ch_data == SYNC_PAT_5) &&
                                    (curr_ch_data_d1 != SYNC_PAT_5)))
                    nx_state = #1 BA_STRDLY1;
            else if (dly_tap_cnt == 6'h3F)
                    nxt_state = #1 BA_SETDLY;
            else
                    nxt_state = #1 curr_state;
end // case: BA_INCDLY1
    BA_STRDLY1 : begin
        nxt_state = #1 BA_INCDLY2;
    end // case: BA_STRDLY1
    BA_INCDLY2 : begin
        if (((curr_ch_data != SYNC_PAT) &&
                            (curr_ch_data_d1 != SYNC_PAT))
                    && ((curr_ch_data != SYNC_PAT_1) &&
                            (curr_ch_data_d1 != SYNC_PAT_1))
                    && ((curr_ch_data != SYNC_PAT_2) &&
                            (curr_ch_data_d1 != SYNC_PAT_2))
                    && ((curr_ch_data != SYNC_PAT_3) &&
                            (curr_ch_data_d1 != SYNC_PAT_3))
                    && ((curr_ch_data != SYNC_PAT_4) &&
                            (curr_ch_data_d1 != SYNC_PAT_4))
                    && ((curr_ch_data != SYNC_PAT_5) &&
                            (curr_ch_data_d1 != SYNC_PAT_5)))
                    nxt_state = #1 curr_state;
        else if (((curr_ch_data != SYNC_PAT) &&
                            (curr_ch_data_d1 == SYNC_PAT))
                    || ((curr_ch_data != SYNC_PAT_1) &&
                            (curr_ch_data_d1 == SYNC_PAT_1))
                    || ((curr_ch_data != SYNC_PAT_2) &&
                            (curr_ch_data_d1 == SYNC_PAT_2))
                    || ((curr_ch_data != SYNC_PAT_3) &&
                            (curr_ch_data_d1 == SYNC_PAT_3))
                    || ((curr_ch_data != SYNC_PAT_4) &&
                            (curr_ch_data_d1 == SYNC_PAT_4))
                    || ((curr_ch_data != SYNC_PAT_5) &&
                            (curr_ch_data_d1 == SYNC_PAT_5)))
                    nxt_state = #1 BA_STRDLY2;
        else if (dly_tap_cnt == 6'h3F)
                    nxt_state = #1 BA_SETDLY;
        else
                    nxt_state = #1 curr_state;
end // case: BA_INCDLY2
    BA_STRDLY2 : begin
        nxt_state = #1 BA_SETDLY;
    end // case: BA_STRDLY2
    BA_SETDLY : begin
        if(dly_tap_cnt == dly_calc)
                    nxt_state = #1 BA_DONE;
        else
                    nxt_state = #1 curr_state;
    end // case: BA_SETDLY
    BA_DONE       : begin
        nxt_state = #1 IDLE;
    end // case: BA_DONE
//////////////////bitalign_end/////////////////////////////
    IDLE: begin
        if ((curr_ch_data[`SDW-1:0]!=`SDW'h00) &&
                        (curr_ch_data[`SDW-1:0]==SYNC_PAT))
            nxt_state = #1 INCCH;
        else if ((curr_ch_data[`SDW-1:0]!=`SDW'h00) &&
                        (curr_ch_data[`SDW-1:0]!=SYNC_PAT))
            nxt_state = #1 GBSP;
        else
            nxt_state = #1 curr_state;
    end // case: IDLE
    GBSP: begin
        nxt_state = #1 WAIT;
    end // case: GBSP
    WAIT: begin
        if ((clkdiv_cnt == 2'h2) &&
                        (curr_ch_data[`SDW-1:0]==SYNC_PAT))
            nxt_state = #1 INCCH;
        else if ((clkdiv_cnt == 2'h2) &&
                        (curr_ch_data[`SDW-1:0]!=SYNC_PAT))
            nxt_state = #1 GBSP;
```

```
                else
                        nxt_state = #1 curr_state;
        end // case: WAIT
        INCCH: begin
                if (ch_cnt == CHANNEL_NOS-1)
                        nxt_state = #1 SYNCD;
                else
                        nxt_state = #1 BA_IDLE;
        end // case: INCCH
        SYNCD: begin
                if (clkdiv_cnt == 2'h3)
                        nxt_state = #1 DONE;
                else
                        nxt_state = #1 curr_state;
        end // case: SYNCD
        DONE:begin
                nxt_state = #1 curr state;
        end // case: DONE
        default:
                nxt_state = #1 curr_state;
        endcase // case(curr_state)
end // block: rx_sm_async
/*****************************************************************
After reset the curr_state should be BA_IDLE
After window tuning if the current channel data and prev channel
                        data is not one of the three derivatives of sync pattern go
                        back to window tuning
This scenario can happen essentially when muxes on two sides are
                        enabled at different times
*****************************************************************/
always @(posedge mux_clkdiv or negedge mux_rst_n)
begin : rx_sm_sync
        if (!mux_rst_n)
                curr_state <= BA_IDLE;
        else if (mux_rxsm_en) begin
                if((curr_state == BA_DONE) && (nxt_state == IDLE)
                                && (~((((curr_ch_data == SYNC_PAT) &&
                                        (curr_ch_data_d1 == SYNC_PAT))
                                || ((curr_ch_data == SYNC_PAT_1) &&
                                        (curr_ch_data_d1 == SYNC_PAT_1))
                                || ((curr_ch_data == SYNC_PAT_2) &&
                                        (curr_ch_data_d1 == SYNC_PAT_2))
                                || ((curr_ch_data == SYNC_PAT_3) &&
                                        (curr_ch_data_d1 == SYNC_PAT_3))
                                || ((curr_ch_data == SYNC_PAT_4) &&
                                        (curr_ch_data_d1 == SYNC_PAT_4))
                                || ((curr_ch_data == SYNC_PAT_5) &&
                                        (curr_ch_data_d1 == SYNC_PAT_5))))))
                        curr_state <= BA_IDLE;
                else
                        curr_state <= nxt_state;
                end // else: !if((curr_state == BA_DONE) &&...
end // block: rx_sm_sync
```

Figure 4:
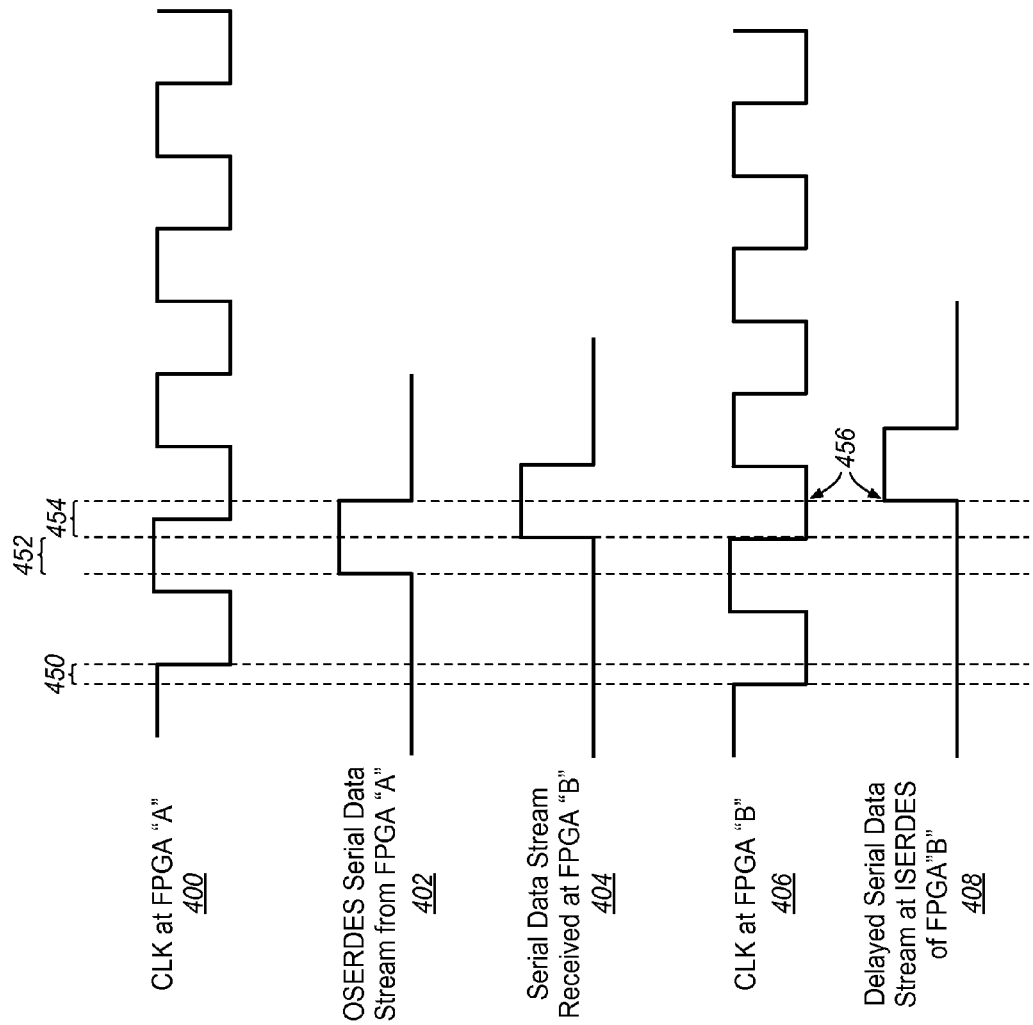
FIG. 4 is a timing diagram describing exemplary timing relationships of signals used by the first and second FPGAs in accordance with features and aspects hereof.

FIG. 4 shows an exemplary timing diagram of signals that may be exchanged between interconnected FPGAs such as those described above in FIGS. 1 and 2. FIG. 4 depicts a number of exemplary signal traces as time advances from left to right in the figure. Traces 400 and 406 respectively represent exemplary clock signals as received at each of FPGA "A" (102 of FIG. 1) and FPGA "B" (104 of FIG. 1). As noted, a common clock signal source such as the core logic clock for the FPGAs may supply the clock signals for all interconnected FPGAs. However, skew 450 may arise relative to the clock signal as applied to each of the pair of interconnected FPGAs. As further noted, such skew, even if relatively small, can negatively impact high speed serial data communications—especially where DDR signaling is employed.

Trace 402 represents a portion of a serial data stream generated by OSERDES of the transmitting FPGA (FPGA "A" 102 of FIG. 1). The serial data stream is generated in accordance with the clock pulse signal represented by trace 400. This transmitted serial data stream is propagated over an interconnecting signal path and received by the receiving FPGA (FPGA "B" 104 of FIG. 1) as represented by trace 404. Skew 452 represents signal skew of the transmitted serial data stream (trace 402) relative to the serial data stream as it is received (trace 404).

In accordance with features and aspects hereof, a programmable delay is applied to the serial data stream to compensate for the skew (i.e., for the total skew of the serial data streams and the clock signals between the two FPGAs). The delay is programmed by a skew adjustment circuit of the receiving FPGA based on an initialization/reset sequence that provides synchronization data between the transmitting and receiving FPGAs. The adjusted delay time is represented as reference 454. As noted above, in some exemplary embodiments, a double data rate (DDR) encoding is used to transmit the serial data stream. In such DDR applications, the delay time preferably is sufficient to align the delayed serial data stream pulses with the center of the bit time clock pulses.

Figure 5:
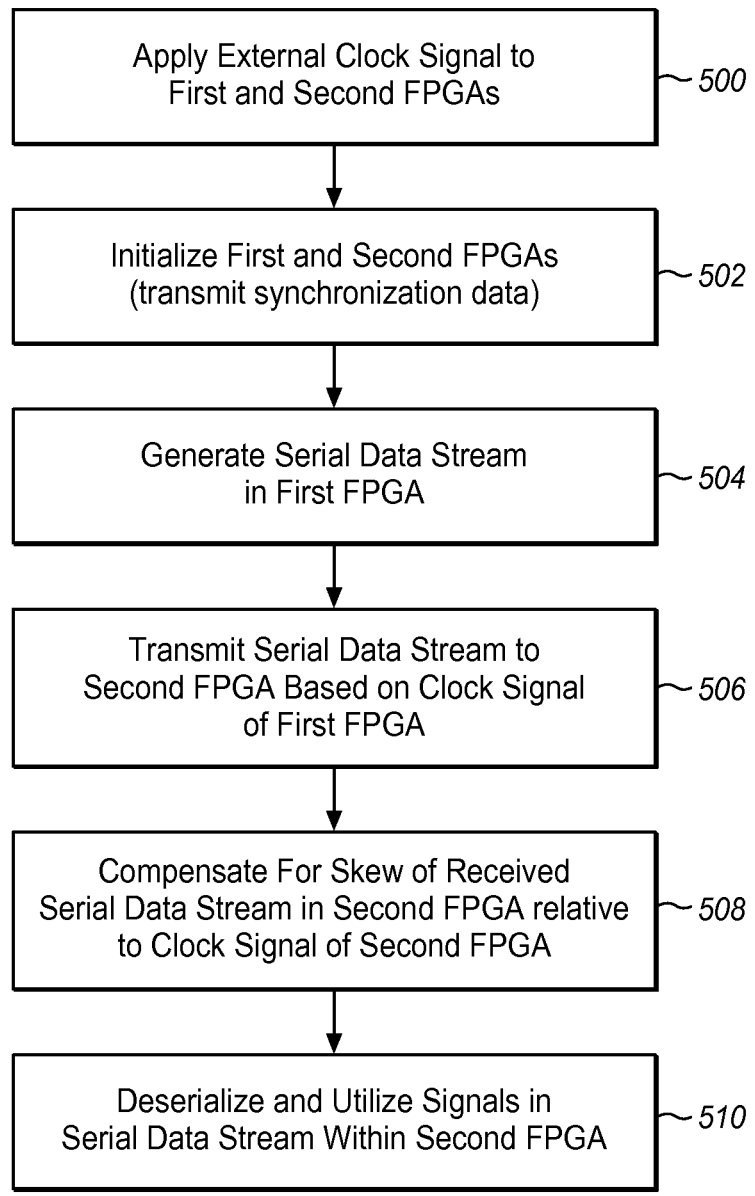
FIG. 5 is a flowchart describing an exemplary method for transmitting signals from a first FPGA to a second FPGA in accordance with features and aspects here.

FIG. 5 is a flowchart describing an exemplary method for transmitting data between a first (transmitting) FPGA and a second (receiving) FPGA in accordance with features and aspects hereof. The method of FIG. 5 is operable in a system comprising a pair of interconnected FPGAs such as system 100 of FIG. 1. At step 500, a clock signal is applied to both the first and second FPGAs. The clock signal is generated by a clock signal source external to both FPGAs. The FPGAs are initialized at step 502. Initialization may be performed at power-on initialization of the FPGAs or in response to any reset condition of the FPGAs. The initialization process may comprise transmitting synchronization data between the first and second FPGAs such the second FPGA (recipient of the synchronization data) may adjust a programmable delay to compensate for skew in the clock signals as applied to both FPGAs and to compensate for propagation delays in the transmission of serial data between the first and second FPGA.

At step 504, the first FPGA generates a serial data stream to be transmitted to the second FPGA. The serial data stream may comprise current values of signals within the first FPGA to be used within the second FPGA (e.g., where the FPGAs represent partitioned portions of an application circuit). The serial data stream is then transmitted from the first FPGA to the second FPGA at step 506. The transmission is based on the clock signal applied to the first FPGA. At step 508, the second (receiving) FPGA compensates for the skew by applying the programmed delay to the received serial data stream. Having so compensated for skew, the second (receiving) FPGA at step 510 de-serializes the delayed, received serial data stream to obtain and utilize the current values from the first FPGA.

Those of ordinary skill in the art will readily recognize numerous equivalent and additional steps that may be present in a fully functional method such as the method of FIG. 5. Such additional and equivalent steps are omitted herein for simplicity and brevity of this discussion.

While the invention has been illustrated and described in the drawings and foregoing description, such illustration and description is to be considered as exemplary and not restrictive in character. One embodiment of the invention and minor variants thereof have been shown and described. In particular, features shown and described as exemplary software or firmware embodiments may be equivalently implemented as customized logic circuits and vice versa. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. An application circuit comprising:
a first field programmable gate array (FPGA) having a serial data output signal and having a clock signal input;
a second FPGA having a serial data input signal and having a clock signal input; and
a clock signal source external to both the first and second FPGAs, the clock signal source adapted to generate a clock signal applied to the clock signal inputs of both the first and second FPGAs,
wherein the first FPGA comprises:
an output serializer/de-serializer (OSERDES) circuit adapted to generate and output on the serial data output a serial data stream representing current values of a plurality of signals within the first FPGA, wherein the OSERDES transmits the serial data stream based on the clock signal received on its clock signal input;
wherein the second FPGA comprises:
a programmable delay circuit having an input signal coupled with the serial data output signal of the first FPGA and having a clock signal input adapted to receive the clock signal and having an output signal, the programmable delay circuit adapted to apply a programmed delay to the serial data stream to generate a delayed serial data stream and further adapted to apply the delayed serial data stream to its output signal; and
an input serializer/de-serializer (ISERDES) adapted to receive the delayed serial data stream output from the programmable delay circuit and further adapted to de-serialize the delayed serial data stream to generate the current values of the plurality of signals within the first FPGA for use within the second FPGA,
wherein the programmable delay of the programmable delay circuit compensates for skew of serial data stream received by the second FPGA relative to the clock signal used by the OSERDES,
wherein the second FPGA further comprises:
a skew adjustment circuit coupled with the ISERDES and coupled with the programmable delay circuit, the skew adjustment circuit adapted to determine the programmable delay and adapted to program the determined programmable delay in the programmable delay circuit,
wherein the OSERDES of the first FPGA is adapted to generate and transmit synchronization data during initialization of the application circuit,
wherein the skew adjustment circuit is operable at initialization of the application circuit to adjust the programmable delay until the synchronization data is correctly detected by the ISERDES of the second FPGA,
wherein the skew adjustment circuit adjusts the programmable delay until it detects bit alignment of the synchronization pattern as received by the ISERDES,
wherein the skew adjustment circuit detects word alignment of the synchronization data as received by the ISERDES responsive to detecting bit alignment,
wherein the skew adjustment circuit enables normal operation of the ISERDES of the second FPGA to receive the delayed serial data stream responsive to detecting word alignment of the synchronization data as received by the ISERDES,
wherein the skew adjustment circuit is adapted to receive the synchronization data as the delayed serial data stream output of the programmable delay circuit, and
wherein the skew adjustment circuit detects bit alignment when a bit of the synchronization data is sensed at a midpoint of a pulse of the clock signal.

2. The application circuit of claim 1 wherein the serial data stream is transmitted by the OSERDES circuit and received by the ISERDES circuit as a double data rate (DDR) serial data stream.

3. The application circuit of claim 1 wherein the clock signal provides a core clock frequency for the first and second FPGAs, and wherein the serial data stream is transmitted and received using the core clock frequency.

4. A method operable in a circuit, the circuit comprising a first FPGA and a second FPGA and a clock signal source external to the first and second FPGAs, the method comprising:

applying a clock signal from the clock signal source to both the first and second FPGAs;
generating a serial data stream in the first FPGA, wherein the serial data stream comprises current values of a plurality of signals within the first FPGA;
transmitting the serial data stream from the first FPGA to the second FPGA wherein the serial data stream is transmitted from the first FPGA based on the clock signal received by the first FPGA and wherein the serial data stream is received by the second FPGA based on the clock signal received by the second FPGA;
compensating, within the second FPGA, for skew of the received serial data stream relative to the clock signal applied to the first and second FPGAs; and
de-serializing the received serial data stream within the second FPGA to generate the current values of the plurality of signals within the first FPGA for use within the second FPGA,
wherein the step of compensating further comprises:
applying a programmed delay to the received serial data stream,
the method further comprising:
automatically determining the programmed delay by operation of the first and second FPGAs,
wherein the step of automatically determining further comprises:
transmitting synchronization data from the first FPGA to the second FPGA; and
determining the programmed delay within the second FPGA based on the synchronization data,
wherein the step of determining the programmed delay further comprises:
adjusting the programmed delay value within the second FPGA while receiving the synchronization data until the second FPGA senses bit alignment and word alignment of the received synchronization data using the clock signal received by the second FPGA,
wherein the second FPGA comprises an input serializer/de-serializer (ISERDES) and the method further comprises:
enabling normal operation of the ISERDES of the second FPGA to receive the delayed serial data stream responsive to detecting word alignment of the synchronization data as received by the ISERDES;
receiving the synchronization data at the second FPGA as the delayed serial data stream; and
detecting bit alignment when a bit of the synchronization data is sensed at a midpoint of a pulse of the clock signal.

* * * * *